United States Patent
Prentice et al.

(10) Patent No.: US 9,432,786 B2
(45) Date of Patent: Aug. 30, 2016

(54) MIC AUDIO NOISE FILTERING

(75) Inventors: Seth M. Prentice, Auburn, ME (US); Shawn Barden, Gorham, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 710 days.

(21) Appl. No.: 13/569,944

(22) Filed: Aug. 8, 2012

(65) Prior Publication Data

US 2013/0034242 A1 Feb. 7, 2013

Related U.S. Application Data

(63) Continuation of application No. 13/189,480, filed on Jul. 22, 2011.

(51) Int. Cl.
*H04B 15/00* (2006.01)
*H04R 29/00* (2006.01)
*G01R 29/26* (2006.01)
*G01R 27/02* (2006.01)

(52) U.S. Cl.
CPC .............. *H04R 29/004* (2013.01); *G01R 29/26* (2013.01); *G01R 27/02* (2013.01); *H04R 2420/01* (2013.01); *H04R 2420/05* (2013.01); *Y10T 307/766* (2015.04)

(58) Field of Classification Search
CPC ............ H04R 29/004; H04R 2420/01; H04R 2420/05; G01R 27/02; G01R 29/26; Y10T 307/766
USPC ....................................................... 381/94.1
See application file for complete search history.

(56) References Cited

U.S. PATENT DOCUMENTS

| | | | |
|---|---|---|---|
| 5,754,552 A | 5/1998 | Allmond et al. | |
| 6,301,344 B1 | 10/2001 | Meyer et al. | |
| 6,650,635 B1 | 11/2003 | Weinstein et al. | |
| 7,053,598 B2 | 5/2006 | Shieh et al. | |
| 7,519,347 B2 * | 4/2009 | Winsvold ............ | G10L 21/0208 455/283 |
| 7,565,458 B2 | 7/2009 | Thijssen et al. | |
| 7,869,608 B2 | 1/2011 | Sander et al. | |

(Continued)

FOREIGN PATENT DOCUMENTS

| | | |
|---|---|---|
| CN | 1441353 A | 9/2003 |
| CN | 1708023 A | 12/2005 |

(Continued)

OTHER PUBLICATIONS

"U.S. Appl. No. 13/188,778, Response filed May 6, 2014 to Final Office Action mailed Mar. 6, 2014", 11 pgs.

(Continued)

*Primary Examiner* — Davetta W Goins
*Assistant Examiner* — Daniel Sellers
(74) *Attorney, Agent, or Firm* — Schwegman Lundberg & Woessner, P.A.

(57) ABSTRACT

This document discusses, among other things, a MIC audio noise filtering system configured to detect MIC audio noise at a pole of a four-pole audio jack using first and second comparators. The MIC audio noise detection system can include first and second comparators configured to compare a value of the pole to respective first and second thresholds and to provide an output indicative of the comparisons and a detection circuit configured to count changes in the output over a first period of time and to detect MIC audio noise at the pole of the four-pole audio jack using the count.

15 Claims, 6 Drawing Sheets

(56) References Cited

U.S. PATENT DOCUMENTS

| | | | |
|---|---|---|---|
| 7,916,875 | B2 | 3/2011 | Kanji |
| 8,064,613 | B1 | 11/2011 | Helfrich |
| 8,150,046 | B2 | 4/2012 | Hansson et al. |
| 8,155,337 | B2 | 4/2012 | Choi et al. |
| 8,193,834 | B2 | 6/2012 | Maher et al. |
| 8,230,126 | B2 | 7/2012 | Siulinski |
| 8,244,927 | B2 | 8/2012 | Chadbourne et al. |
| 8,290,537 | B2 | 10/2012 | Lee et al. |
| 8,467,828 | B2 | 6/2013 | Johnson et al. |
| 8,489,782 | B2 | 7/2013 | Chadbourne et al. |
| 8,817,994 | B2 | 8/2014 | Turner et al. |
| 8,831,234 | B2 | 9/2014 | Turner et al. |
| 8,914,552 | B2 | 12/2014 | Chadbourne et al. |
| 2005/0201568 | A1* | 9/2005 | Goyal .............................. 381/74 |
| 2006/0009937 | A1* | 1/2006 | Bigrigg ........................ 702/104 |
| 2006/0147059 | A1 | 7/2006 | Tang |
| 2007/0133828 | A1 | 6/2007 | Kanji |
| 2008/0112572 | A1 | 5/2008 | Wong et al. |
| 2008/0137896 | A1 | 6/2008 | Tsen |
| 2008/0140902 | A1 | 6/2008 | Townsend et al. |
| 2008/0150512 | A1 | 6/2008 | Kawano |
| 2008/0247241 | A1 | 10/2008 | Nguyen et al. |
| 2008/0298607 | A1 | 12/2008 | Wu et al. |
| 2008/0318629 | A1 | 12/2008 | Inha et al. |
| 2009/0136058 | A1 | 5/2009 | Choi et al. |
| 2009/0198841 | A1 | 8/2009 | Yoshida et al. |
| 2009/0285415 | A1 | 11/2009 | Wu |
| 2010/0166205 | A1* | 7/2010 | Yamaoka et al. ............ 381/71.6 |
| 2010/0173673 | A1 | 7/2010 | Lydon |
| 2010/0199112 | A1 | 8/2010 | Yokota et al. |
| 2011/0085673 | A1* | 4/2011 | Lee ........................ H01R 24/58 |
| | | | 381/74 |
| 2011/0099298 | A1 | 4/2011 | Chadbourne et al. |
| 2011/0099300 | A1 | 4/2011 | Siulinski |
| 2011/0199123 | A1 | 8/2011 | Maher et al. |
| 2012/0019306 | A1 | 1/2012 | Turner et al. |
| 2012/0019309 | A1 | 1/2012 | Turner et al. |
| 2012/0057078 | A1 | 3/2012 | Fincham et al |
| 2012/0128185 | A1 | 5/2012 | Wu |
| 2012/0170776 | A1 | 7/2012 | Han |
| 2012/0198183 | A1 | 8/2012 | Wetzel et al. |
| 2012/0200172 | A1 | 8/2012 | Johnson et al. |
| 2012/0237051 | A1 | 9/2012 | Lee |
| 2012/0263313 | A1 | 10/2012 | Yu et al. |
| 2012/0326736 | A1 | 12/2012 | Chadbourne et al. |
| 2013/0020882 | A1 | 1/2013 | Prentice |
| 2013/0021041 | A1 | 1/2013 | Prentice |
| 2013/0021046 | A1 | 1/2013 | Prentice et al. |
| 2014/0025845 | A1 | 1/2014 | Chadbourne et al. |

FOREIGN PATENT DOCUMENTS

| | | |
|---|---|---|
| CN | 1728082 A | 2/2006 |
| CN | 2819226 Y | 9/2006 |
| CN | 1859813 A | 11/2006 |
| CN | 101069410 A | 11/2007 |
| CN | 101184345 A | 5/2008 |
| CN | 101227762 A | 7/2008 |
| CN | 101425048 A | 5/2009 |
| CN | 101426035 A | 5/2009 |
| CN | 101453510 A | 6/2009 |
| CN | 101489159 A | 7/2009 |
| CN | 101719610 A | 6/2010 |
| CN | 101729958 A | 6/2010 |
| CN | 101778320 A | 7/2010 |
| CN | 101820566 A | 9/2010 |
| CN | 102045620 A | 5/2011 |
| CN | 102193047 A | 9/2011 |
| CN | 102378087 A | 3/2012 |
| CN | 102892059 A | 1/2013 |
| CN | 102892061 A | 1/2013 |
| CN | 102892067 A | 1/2013 |
| CN | 102892068 A | 1/2013 |
| CN | 102193047 B | 5/2014 |
| CN | 102378087 B | 6/2014 |
| CN | 104699636 A | 6/2015 |
| CN | 104699637 A | 6/2015 |
| KR | 20110046361 A | 5/2011 |
| KR | 1020120015265 A | 2/2012 |
| KR | 1020130011988 A | 1/2013 |
| KR | 1020130011989 A | 1/2013 |
| KR | 1020130011990 A | 1/2013 |
| KR | 1020130011991 A | 1/2013 |
| TW | 201312873 A1 | 3/2013 |
| TW | 201312874 A1 | 3/2013 |
| TW | 201314674 A1 | 4/2013 |
| TW | 201316704 A1 | 4/2013 |

OTHER PUBLICATIONS

"U.S. Appl. No. 13/189,480, Final Office Action mailed Aug. 18, 2014", 15 pgs.

"U.S. Appl. No. 13/189,480, Preliminary Amendment mailed Feb. 8, 2012", 10 pgs.

"U.S. Appl. No. 13/941,889, Notice of Allowance mailed Aug. 20, 2014", 7 pgs.

"U.S. Appl. No. 13/941,889, Preliminary Amendment filed Oct. 3, 2013", 7 pgs.

"U.S. Appl. No. 13/941,889, Response filed Jul. 24, 2014 to Non Final Office Action mailed Apr. 24, 2014", 7 pgs.

"Chinese Application Serial No. 201010526298.1, Response filed Jun. 10, 2014", w/English Claims, 12 pgs.

"Chinese Application Serial No. 201110209513.X, Office Action mailed Oct. 10, 2014", w/English Translation, 6 pgs.

"Chinese Application Serial No. 201110209513.X, Response filed Jun. 17, 2014", w/English Claims, 35 pgs.

"Chinese Application Serial No. 201210256950.1, Office Action mailed Sep. 3, 2014", w/English Claims, 10 pgs.

"Chinese Application Serial No. 201210256958.8, Office Action mailed Sep. 3, 2014", w/English Claims, 12 pgs.

"U.S. Appl. No. 13/188,778, Non Final Office Action mailed Sep. 10, 2013", 18 pgs.

"U.S. Appl. No. 13/188,834, Non Final Office Action mailed Sep. 24, 2013", 15 pgs.

"Chinese Application Serial No. 201010526298.1, Office Action mailed Sep. 4, 2013", 10 pgs.

"Chinese Application Serial No. 201110038132.X, Office Action mailed Aug. 9, 2013", 11 pgs.

"Chinese Application Serial No. 201110209512.5, Office Action mailed Sep. 4, 2013", 5 pgs.

"U.S. Appl. No. 13/188,778, Final Office Action mailed Mar. 6, 2014", 15 pgs.

"U.S. Appl. No. 13/188,778, Response filed Feb. 10, 2014 to Non Final Office Action mailed Sep. 10, 2013", 14 pgs.

"U.S. Appl. No. 13/188,834, Final Office Action mailed Feb. 21, 2014", 11 pgs.

"U.S. Appl. No. 13/188,834, Notice of Allowance mailed Apr. 28, 2014", 9 pgs.

"U.S. Appl. No. 13/188,834, Response filed Jan. 24, 2014 to Non Final Office Action mailed Sep. 24, 2013", 12 pgs.

"U.S. Appl. No. 13/188,834, Response filed Apr. 21, 2014 to Final Office Action mailed Feb. 21, 2014", 8 pgs.

"U.S. Appl. No. 13/189,480, Non Final Office Action mailed Mar. 14, 2014", 14 pgs.

"U.S. Appl. No. 13/941,889, Non Final Office Action mailed Apr. 24, 2014", 7 pgs.

"Chinese Application Serial No. 201010526298.1, Office Action mailed Apr. 3, 2014", w/English Translation, 11 pgs.

"Chinese Application Serial No. 201010526298.1, Response filed Jan. 14, 2014 to Office Action mailed Sep. 4, 2013", w/English Claims, 21 pgs.

"Chinese Application Serial No. 201110038132.X, Response filed Dec. 23, 2013 to Office Action mailed Aug. 9, 2013", w/English Claims, 8 pgs.

"Chinese Application Serial No. 201110209512.5, Response filed Jan. 20, 2014 to Office Action mailed Sep. 4, 2013", w/English Claims, 53 pgs.

"Chinese Application Serial No. 201110209513.X, Office Action mailed Feb. 8, 2014", w/English Translation, 9 pgs.

(56) References Cited

OTHER PUBLICATIONS

"U.S. Appl. No. 13/188,778, Notice of Allowance mailed May 30, 2014", 8 pgs.

"U.S. Appl. No. 13/189,480, Response filed Jun. 16, 2014 to Non Final Office Action mailed Mar. 14, 2014", 10 pgs.

"Chinese Application Serial No. 201210257009.1, Office Action mailed Jun. 17, 2014", 8 pgs.

"Chinese Application Serial No. 201210257100.3, Office Action mailed Jun. 19, 2014", 8 pgs.

"U.S. Appl. No. 12/606,562 , Response filed Jan. 3, 2012 to Final Office Action mailed Oct. 28, 2011", 7 pgs.

"U.S. Appl. No. 12/606,562 , Response filed Sep. 13, 2011 to Non Final Office Action mailed Jun. 22, 2011", 9 pgs.

"U.S. Appl. No. 12/606,562, Final Office Action mailed Oct. 28, 2011", 10 pgs.

"U.S. Appl. No. 12/606,562, Non Final Office Action mailed Jun. 22, 2011", 9 pgs.

"U.S. Appl. No. 12/606,562, Notice of Allowance Mailed Jan. 27, 2012", 7 pgs.

"U.S. Appl. No. 12/606,562, Response to Rule 312 Communication mailed May 29, 2012", 1 pgs.

"U.S. Appl. No. 12/606,562, Response to Rule 312 Communication mailed Jul. 2, 2012", 2 pgs.

"U.S. Appl. No. 12/606,582, Final Office Action mailed Dec. 8, 2011", 10 pgs.

"U.S. Appl. No. 12/606,582, Non Final Office Action mailed Jul. 14, 2011", 8 pgs.

"U.S. Appl. No. 12/606,582, Notice of Allowance mailed Apr. 12, 2012", 8 pgs.

"U.S. Appl. No. 12/606,582, Response filed Mar. 6, 2012 to Final Office Action mailed Dec. 8, 2011", 10 pgs.

"U.S. Appl. No. 12/606,582, Response filed Sep. 28, 2011 to Non Final Office Action mailed Jul. 14, 2011", 10 pgs.

"U.S. Appl. No. 12/705,183, Notice of Allowance mailed Feb. 9, 2012", 8 pgs.

"U.S. Appl. No. 13/584,465 , Response filed Jan. 9, 2013 to Non Final Office Action mailed Nov. 15, 2012", 8 pgs.

"U.S. Appl. No. 13/584,465, Non Final Office Action mailed Nov. 15, 2012", 8 pgs.

"U.S. Appl. No. 13/584,465, Notice of Allowance mailed Mar. 18, 2013", 7 pgs.

"Autonomous Audio Headset Switch", Texas Instruments TS3A225E, [Online]. Retrieved from the Internet: <URL:http://www.ti.com/lit/ds/scds329/scds329.pdf>, (Nov. 2011), 11 pgs.

"Chinese Application Serial No. 201220044818.X, Notification to Make Rectification mailed Jul. 17, 2012", 3 pg.

"Korean Application Serial No. 10-2011-0073717, Amendment filed Aug. 19, 2011", 4 pgs.

"USB OTG Mechanical Presentation", [Online] Retrieved from the Internet on Jun. 3, 2011 http://www.usb.org/developers/onthego/london/OTG_mechanical.pdf, (Feb. 26, 2002), 27 pgs.

"USB Remote Cable", [Online]. Retrieved from the Internet: <URL:http://chdk.wikia.com/wiki/USB_Remote_Cable>, (Jun. 9, 2009), 4 pgs.

Mehta, Arpit, "Keep Power Consumption in Check with Low-Power Comparators that Autosense Plugged-In Accessories", [Online]. Retrieved from the Internet: <URL:http://www.maxim-ic.com/appnotes.cfm/an_pk/4327>, (Feb. 27, 2009), 6 pgs.

"U.S. Appl. No. 13/189,480, Non Final Office Action mailed Mar. 13, 2015", 18 pgs.

"U.S. Appl. No. 13/189,480, Response filed Dec. 18, 2014 to Final Office Action mailed Aug. 18, 2014", 10 pgs.

"Chinese Application Serial No. 201010526298.1, Office Action mailed Sep. 30, 2014", 5 pgs.

"Chinese Application Serial No. 201010526298.1, Response filed Nov. 4, 2014 to Office Action mailed Sep. 30, 2014", 19 pgs.

"Chinese Application Serial No. 201110209513.X,Response filed Jan. 26, 2015 to Office Action mailed Oct. 10, 2014", w/ English Translation, 15 pgs.

"Chinese Application Serial No. 201210257100.3, Office Action mailed Feb. 4, 2015", 8 pgs.

"U.S. Appl. No. 13/189,480, Response filed Jun. 4, 2015 to Non Final Office Action mailed Mar. 13, 2015", 11 pgs.

"U.S. Appl. No. 13/189,480, Supplemental Response filed Jun. 16, 2015 to Non Final Office Action mailed Mar. 13, 2015", 11 pgs.

"U.S. Appl. No. 13/569,746, Ex Parte Quayle Action mailed Jun. 30, 2015", 6 pgs.

"U.S. Appl. No. 13/569,869, Non Final Office Action mailed Jun. 11, 2015", 10 pgs.

"U.S. Appl. No. 13/189,480, Response filed Jun. 4, 2015 to Non Final Office Action mailed Mar. 11, 2015", 11 pgs.

"Chinese Application Serial No. 201210257100.3, Response filed Jun. 19, 2015 to Office Action mailed Feb. 4, 2015", w/ English Claims, 9 pgs.

"Chinese Application Serial No. 201210257100.3,Response filed Nov. 24, 2014 to Office Action mailed Jun. 19, 2014", not in English, 3 pgs.

\* cited by examiner

MIC AUDIO NOISE FILTERING

CLAIM OF PRIORITY

This application is a continuation of and claims the benefit of priority under 35 U.S.C. §120 to Seth M. Prentice, U.S. patent application Ser. No. 13/189,480, titled "MIC/GND DETECTION AND AUTOMATIC SWITCH," filed on Jul. 22, 2011, which is hereby incorporated by reference in its entirety.

BACKGROUND

Figure 1:
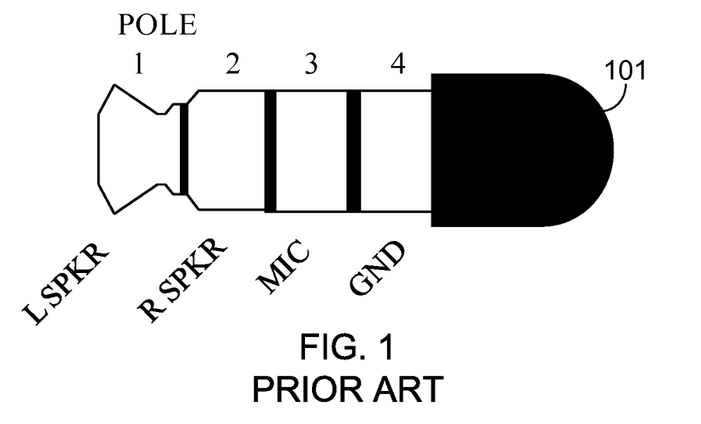
FIGS. 1-2 illustrate generally example four-pole audio jack configurations.
Figure 2:
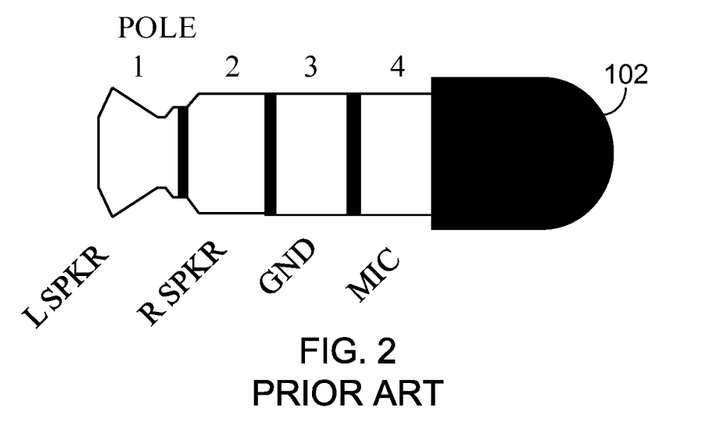

Many mobile devices, such as mobile phones or other portable electronics, include audio jacks configured to receive external audio accessories having an audio plug. However, audio plugs can have varying configurations, which can create issues for headset manufacturers and end users, as manufacturers can be forced to build specific phone configurations based on region, and end users can be forced to use only specific accessories with their mobile device FIGS. 1-2 illustrate generally two example four-pole audio jack configurations. FIG. 1 illustrates generally an example of a four-pole audio plug 101 in an open mobile terminal platform (OMTP) configuration including a left speaker (LSPKR) pole at pole-1, a right speaker (RSPKR) pole at pole-2, a microphone (MIC) pole at pole-3, and a ground (GND) pole at pole-4. FIG. 2 illustrates generally an example of a four-pole audio jack 102 in an American Standard configuration including a LSPKR pole at pole-1, a RSPKR pole at pole-2, a MIC pole at pole-3, and a GND pole at pole-4. In other examples, other configurations can be realized, for example, a three-pole audio plug with GND poles at both pole-3 and pole-4.

OVERVIEW

This document discusses, among other things, a MIC audio noise filtering system configured to detect MIC audio noise at a pole of a four-pole audio jack using first and second comparators. The MIC audio noise detection system can include first and second comparators configured to compare a value of the pole to respective first and second thresholds and to provide an output indicative of the comparisons and a detection circuit configured to count changes in the output over a first period of time and to detect MIC audio noise at the pole of the four-pole audio jack using the count.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, an audio jack detection switch for three or four-pole accessories that can detect the location of a ground (GND) pole and a microphone (MIC) pole on an audio plug coupled to the audio jack and automatically route the GND and MIC poles to the appropriate connection (e.g., GND, a MIC connection of an audio sub system, such as a codec, etc.), for example, without a separate selection input, allowing manufacturers and end users to freely use accessories with different pole configurations.

In an example, the audio jack detection switch can be configured to detect and validate that an audio plug has been coupled to an audio jack, to distinguish between three and four-pole audio plugs, to detect the polarity of the GND and MIC poles on a four-pole audio plug (e.g., using impedance measurements, etc.), and to automatically route the GND and MIC poles to the appropriate connections. In certain examples, because mobile devices can be required to operate in noisy environments, the audio jack detection switch can be configured to filter noise associated with mobile communications (e.g., Global System for Mobile Communication (GSM) noise, audio noise, etc.), such as when detecting or measuring audio plug impedance, which can eliminate errors in noisy environments.

Figure 3:
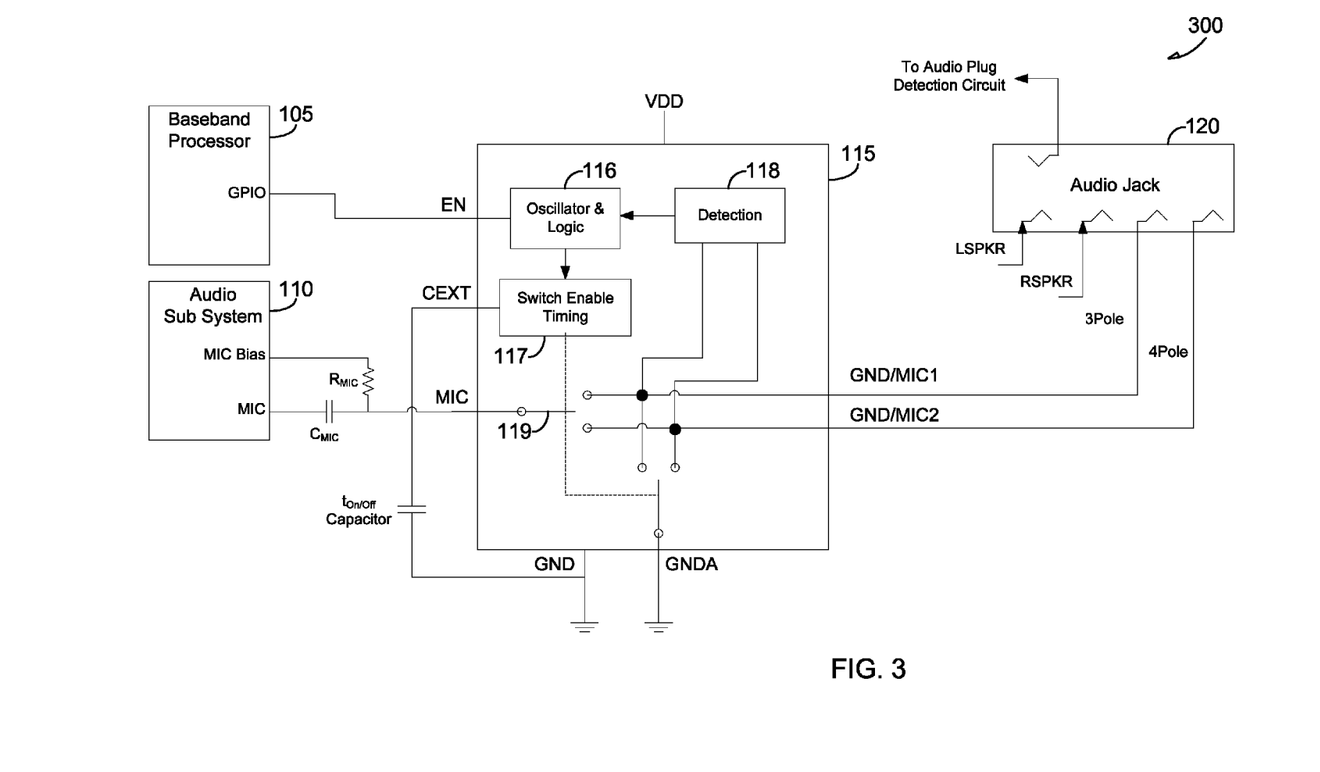
FIG. 3 illustrates generally an example audio jack detection switch.

FIG. 3 illustrates generally an example of a system 300 including a baseband processor 105 (e.g., of a mobile device), an audio sub system 110 (e.g., a codec), an audio jack detection switch 115, and an audio jack 120. In an example, the audio jack detection switch 115 can include an oscillator and logic 116, switch enable timing 117, a detection circuit 118, and a crosspoint switch 119 or one or more other switches. In an example, the audio jack 120 can include a four-pole audio jack configured to receive a three or four-pole audio plug or other audio accessory.

In an example, the audio jack 120 can include connections for each of the four poles, such as a left speaker (LSPKR) connection, a right speaker (RSPKR) connection, a pole-3 connection, and a pole-4 connection.

In certain examples, the audio jack detection switch 115 can be configured to detect and validate that an audio plug has been received by the audio jack 120, distinguish between three and four-pole audio plugs, and detect send/end key activation, such as described in the commonly assigned John R. Turner et al. U.S. patent application Ser. No. 13/188,778, entitled "Audio Jack Detection and Configuration," filed on Jul. 22, 2011, which is hereby incorporated by reference in its entirety.

In an example, the audio jack detection switch 115 can be configured to detect what is connected to the pole-3 and pole-4 connections of the audio jack. In an example, the audio jack detection switch 115 can determine between various audio plug configurations, including at least one of:
1) a three-pole audio plug, with the pole-3 and pole-4 plugs shorted (e.g., grounded);
2) a four-pole audio plug, with the pole-3 plug including a MIC pole and the pole-4 plug including a GND pole;
3) a four-pole audio plug, with the pole-3 plug including a GND pole and the pole-4 plug including a MIC pole;
4) floating or open connections at the pole-3 and pole-4 plugs; or 5) one or more other configurations, such as a video connection.

After the detection or determination is complete, the audio jack detection switch 115 can be configured to automatically route the poles to the appropriate connection (e.g., the MIC pole to the MIC input of the audio sub system 110, the GND pole to a ground connection, such as at the audio jack detection switch 115, the audio sub system 110, the baseband processor 105, etc. In an example, after automatically switching or routing the poles to the appropriate connection, the audio jack detection switch 115 can be configured to enter a low power mode to reduce power consumption.

Figure 4:
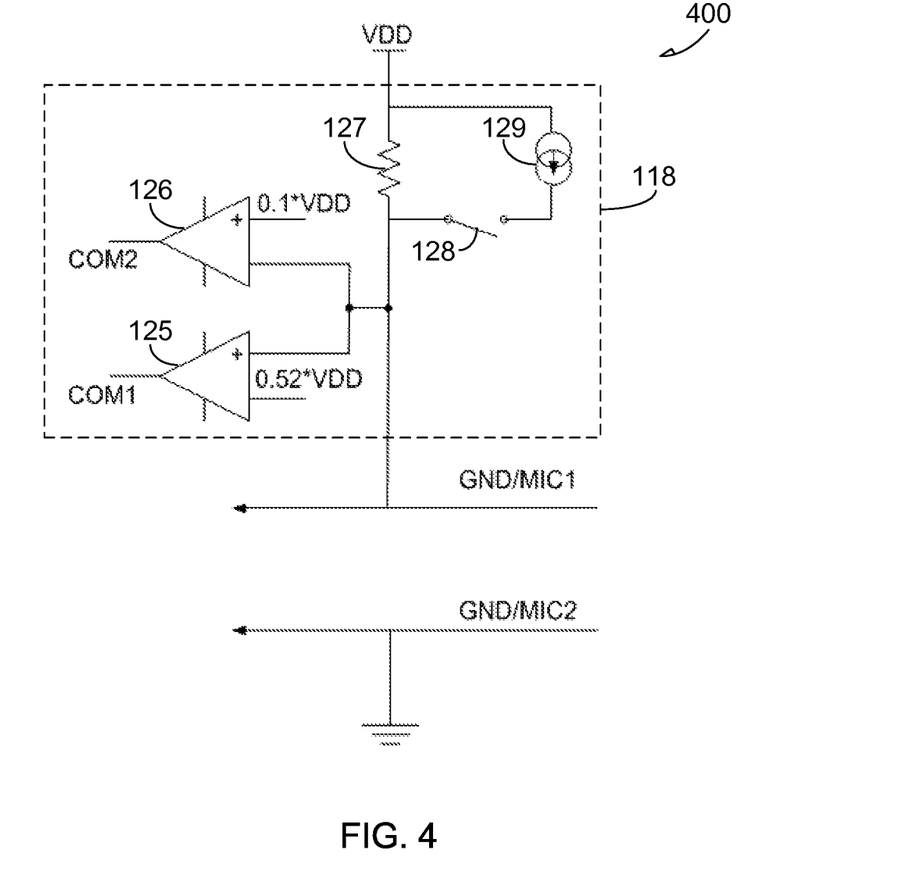
FIG. 4 illustrates generally an example detection circuit.

FIG. 4 illustrates generally an example of a system 400 including a detection circuit 118 including one or more comparators (e.g., first and second comparators 125, 126), a resistor 127 (e.g., 40 KΩ, etc.), a switch 128, and a current source 129. In an example, the detection circuit 118 can be configured to detect or measure the impedance of the pole-3 and pole-4 connections of the audio jack by selectively coupling one of the GND/MIC1 or GND/MIC2 connections to the detection circuit 118.

In an example, the first and second comparators 125, 126 can include different threshold voltages (e.g., illustrated in FIG. 4 as 0.52*VDD and 0.1*VDD for the first and second comparators 125, 126, respectively, or one or more other threshold voltages). In certain examples, the threshold voltages can be selected or controlled to provide different detection stages. Further, the different threshold voltages coupled with the combination of the voltage source VDD and the current source 129, controllable using the switch 128, can provide multiple detection stages that can optimize current for detecting different loads (e.g., closing the switch 128 and using the combination of VDD and the current source 129 to detect the impedance on the GND/MIC1 or GND/MIC2 connection). Further, the high impedance DC measurement technique can minimize the pop & click in headphones or speakers.

In an example, the first and second comparators 125, 126 can be used to detect GSM noise, and to distinguish between GSM noise and audio noise. Generally, the first and second comparators 125, 126 can be monitored for state changes. If the state changes 3 clock cycles, a counter is incremented. If the state changes continue to change for a period of time (e.g., 100 mS), the counter can be compared to a specified range. In an example, the range can include between 34 and 54, which corresponds to the frequency of the GSM noise, or approximately 217 Hz. If GSM noise is determined, the audio jack detection switch can wait and start detection again. If the count is not within the range, it is assumed that the noise is audio noise, and that the audio jack includes a forward bias four-pole audio jack with pole-3 as the MIC pole.

Figure 5:
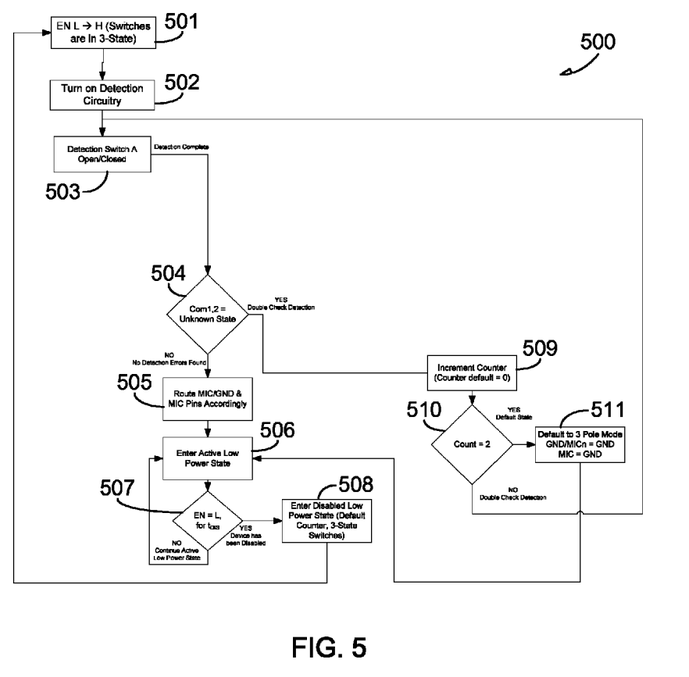
FIGS. 5-6 illustrate generally example detection flow diagrams.

FIG. 5 illustrates generally an example detection flow diagram 500 including detecting the impedance of audio plug poles (e.g., the GND and MIC poles on a four-pole audio plug, pole-3 and pole-4, etc.) and validating the detection (e.g., using a series of sequential detections, using different detection stages, etc.). If the detection is invalid or unknown, the impedance can be re-detected. In an example, if the detection is valid, the audio jack detection switch can automatically route the poles to the proper connections (e.g., the GND pole to a GND connection, the MIC pole to a MIC connection on the audio sub system, etc.) and enter an active low power state.

At 501, a baseband processor (e.g., the baseband processor 105) can provide an enable (EN) signal to an audio jack detection switch (e.g., the audio jack detection switch 115) and, at 502, a detection circuit (e.g., the detection circuit 118) can be turned on. In an example, the detection circuit can be triggered by detecting that the audio jack has received an audio plug.

At 503, a switch (e.g., the switch 128) in the detection circuit can be opened and closed. At 504, when the detection is complete, the state of the comparators (e.g., first and second comparators 125, 126) can be queried.

At 504, if the state of the connections is known, at 505, the audio jack detection switch can automatically route both the audio plug poles to the appropriate connection (e.g., GND, MIC, etc.), such as by using the crosspoint switch. At 506, an active low power state can be enabled. At 507, if the enable signal remains low for a specific time period, a disabled low power state can be entered, and process flow can return to step 501.

At 504, if the state of the connections is unknown, a counter can be incremented at 509. At 510, if the count is less than a first number (e.g., 2, etc.), the process can return to step 503. At 510, if the count is equal to the first number (e.g., 2, etc.), the audio jack detection switch can default to a three-pole audio plug and automatically route both of the pole-3 and pole-4 connections to GND.

Figure 6:
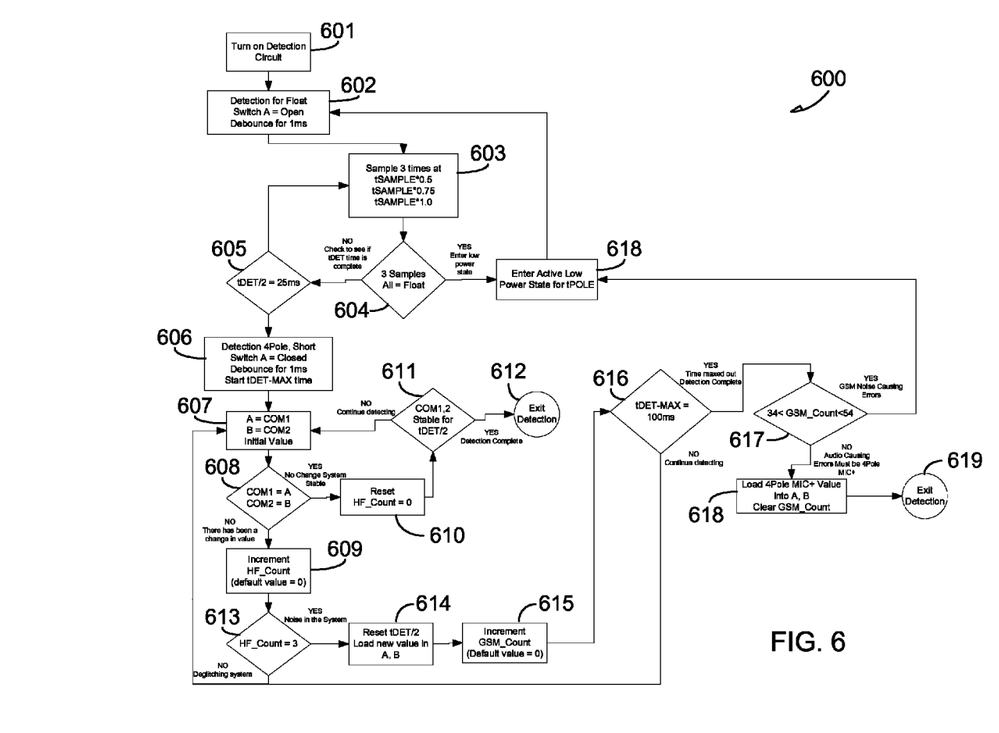

FIG. 6 illustrates generally an example detection flow diagram 600 including detecting the impedance of audio plug poles. Generally, the switch coupling the current source to the detection circuit can be open to detect no connection or to determine if pole-3 and pole-4 are floating. To detect for MIC polarity or for a short, the switch can be closed.

At 601, a detection circuit can be turned on. At 602, the switch can be opened, and the audio jack detection switch can be configured to detect a float with a debounce of 1 mS. At 603, the sample is taken a predetermined number of times (e.g., three times) within a sample period, (e.g., tSAMPLE*0.5, tSAMPLE*0.75, tSAMPLE*1.0, etc.). At 604, if each of the predetermined number of samples are detected as floating, an active low power state can be entered at 618, and process flow can return to step 602.

Generally, when a float is detected, the detection circuit can enter a low power mode for a specified time period (e.g., tPOLE). After the specified time period, the detection circuit can detect again. If a float is detected again, the low power mode loop can continue. If the detection is not float, the detection device can move on to test for a short or MIC polarity. If a float is ever detected, the detection device can default back to the low power state for the specified time period.

At 604, if each of the predetermined number of samples are not detected as floating after a period of time at 605, the audio jack can be detected at 606 as a four-pole audio jack and the switch can be closed.

At 607, variables "A" and "B" are set at an initial value and then compared, at 608, to the values of the first and second comparators. At 610, if there are no changes to the values of the first and second comparators, a high frequency count can be reset. At 611, if the values of the first and second comparators are still valid, then the detection is complete at 612. If the values of the first and second are not valid, process flow can return to step 607.

At 608, if the values of the first and second comparators changed, then at 609, the high frequency count can be incremented. At 613, if the high frequency count is less than a specified number (e.g., three, etc.), process flow can return to step 607. If the high frequency count is equal to the specified number, the values of variables "A" and "B" can be updated at 614 and a GSM count can be incremented at

615. At 616, process flow returns to step 607 until a time period is reached. During this period, if the values of the first and second comparators continues to change, the number of GSM count, representing GSM noise, can continue to increase.

At 617, once the timer has maxed out, the GSM count can be compared to a range, illustrated in FIG. 6 as greater than 34 but less than 54. In an example, this range can correspond to the approximate number of faults caused by GSM noise during the time period of step 616, or approximately 217 Hz. If the GSM count is not within the range, at 618 the noise at the comparator output must be audio noise, indicating a four-pole audio jack with a forward biased microphone and pole-3 corresponding to the MIC pole. At 619, detection is exited. At 617, if the GSM count is within the range, then GSM noise is causing the error, and process flow returns to step 618.

Figure 7:
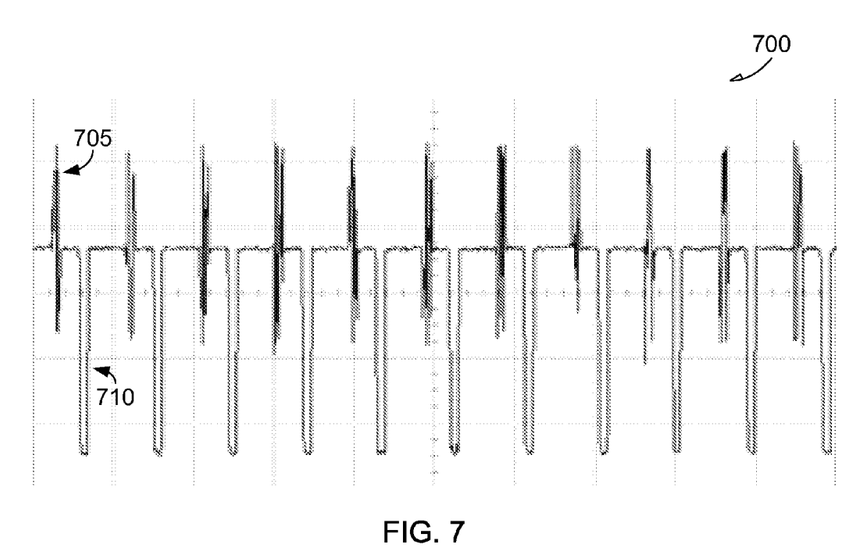
FIGS. 7-8 illustrate generally example output waveforms.

FIG. 7 illustrates generally an example comparator output 700 including a plurality of GSM noise occurrences 705, at approximately 217 Hz, the burst rate of the GSM transmission, causing the output of the comparator to change values, for example, at 710. In certain examples, the comparator changes can be counted, and GSM noise can be distinguished from audio noise by the number of occurrences during a specified time period.

Figure 8:
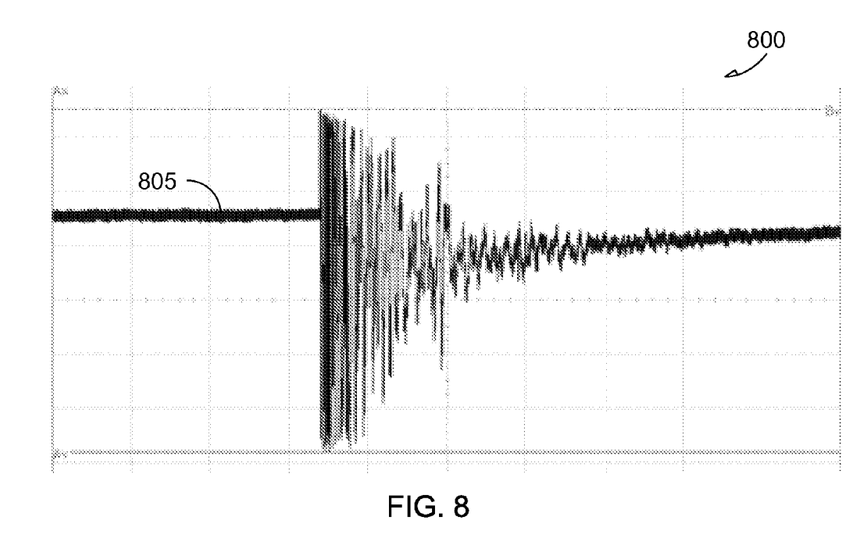

FIG. 8 illustrates generally an example microphone audio output 800, including a microphone output 805. When a microphone is forward biased, the JFET type microphone can change impedance with audio noise. During detection, these impedance changes can cause the comparators to change states. This state change can pass the comparator voltage references, and the audio filter will identify when audio is present. Generally, the audio jack detection switch can identify audio noise from GSM noise by the frequency or total occurrences of the noise within a specified time period.

ADDITIONAL NOTES

In Example 1, a MIC audio noise filtering circuit includes first and second comparators configured to compare a value of a pole of a four-pole audio jack to respective first and second thresholds and to provide an output indicative of the comparisons and a detection circuit configured to count changes in the output over a first period of time and to detect MIC audio noise at the pole of the four-pole audio jack using the count.

In Example 2, the detection circuit of Example 1 is optionally configured to provide an indication of a type of the pole using the count, wherein the type of pole includes a MIC pole.

In Example 3, the output of the first and second comparators of any one or more of Examples 1-2 optionally defines three states, including a first state wherein the value at the pole exceeds the first and second thresholds, a second state wherein the value at the pole exceeds the second threshold, but does not exceed the first threshold, and a third state wherein the value at the pole does not exceed the first and second thresholds.

In Example 4, the detection circuit of any one or more of Examples 1-3 is optionally configured to increment the count when at least one of the output of the first and second comparators has changed a first number of times.

In Example 5, the first number of times of any one or more of Examples 1-4 is optionally 3.

In Example 6, the detection circuit of any one or more of Examples 1-5 is optionally configured to detect MIC audio noise at the pole of the four-pole audio jack if the count is within a specified range over the first period of time, the specified range not corresponding to the frequency of GSM communication.

In Example 7, the specified range of any one or more of Examples 1-6 optionally includes (1) above 1 and between 34 and (2) above 54, wherein the first period of time of any one or more of Examples 1-6 is optionally 100 ms, and wherein the frequency of GSM communication of any one or more of Examples 1-6 optionally includes 217 Hz.

In Example 8, a method includes comparing a value of a pole of a four-pole audio jack to respective first and second thresholds, providing an output indicative of the comparisons, counting changes in the output over a first period of time, and detecting MIC audio noise at the pole of the four-pole audio jack using the count.

In Example 9, any one or more of Examples 1-8 optionally includes providing an indication of a type of the pole using the count.

In Example 10, the counting changes in the output of any one or more of Examples 1-9 optionally includes incrementing a count when at least one of the output of the first and second comparators has changed a first number of times.

In Example 11, the first number of times of any one or more of Examples 1-10 is optionally 3.

In Example 12, the detecting MIC audio noise at the pole of the four-pole audio jack using the counting of any one or more of Examples 1-11 optionally includes detecting MIC audio noise at the pole of the four-pole audio jack if the count is within a specified range over the first period of time, the specified range optionally not corresponding to the frequency of GSM communication.

In Example 13, the specified range of any one or more of Examples 1-12 optionally includes (1) above 1 and below 34 and (2) above 54, wherein the first period of time is 100 ms, and wherein the frequency of GSM communication of any one or more of Examples 1-12 optionally includes 217 Hz.

In Example 14, a system or apparatus can include, or can optionally be combined with any portion or combination of any portions of any one or more of Examples 1-13 to include, means for performing any one or more of the functions of Examples 1-13, or a machine-readable medium including instructions that, when performed by a machine, cause the machine to perform any one or more of the functions of Examples 1-13.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A MIC audio noise filtering circuit, comprising:
   first and second comparators configured to compare a value of a pole of a four-pole audio jack to respective first and second thresholds and to provide an output indicative of the comparisons; and
   a detection circuit configured to count a number of changes in the output over a first period of time and to detect MIC audio noise at the pole of the four-pole audio jack using the count.

2. The MIC audio noise filtering circuit of claim 1, wherein the detection circuit is configured to provide an indication of a type of the pole using the count, wherein the type of pole includes a MIC pole.

3. The MIC audio noise filtering circuit of claim 1; wherein the output of the first and second comparators defines three states, including:
   a first state wherein the value at the pole exceeds the first and second thresholds;
   a second state wherein the value at the pole exceeds the second threshold, but does not exceed the first threshold; and
   a third state wherein the value at the pole does not exceed the first and second thresholds.

4. The MIC audio noise filtering circuit of claim 1, wherein the detection circuit is configured to increment the count when at least one of the output of the first and second comparators has changed a first number of times.

5. The MIC audio noise filtering circuit of claim 4, wherein the first number of times is 3.

6. The MIC audio noise filtering circuit of claim 1, wherein the detection circuit is configured to detect MIC audio noise at the pole of the four-pole audio jack if the count is within a specified range over the first period of time, the specified range not corresponding to the frequency of GSM communication.

7. The MIC audio noise filtering circuit of claim 6, wherein the specified range includes:
   (1) above 1 and below 34; and
   (2) above 54; and
   wherein the first period of time is 100 ms.

8. A MIC audio noise filtering method, comprising:
   comparing a value of a pole of a four-pole audio jack to respective first and second thresholds;
   providing an output indicative of the comparisons;
   counting a number of changes in the output over a first period of time; and
   detecting MIC audio noise at the pole of the four-pole audio jack using the count.

9. The MIC audio noise filtering method of claim 8, including providing an indication of a type of the pole using the count.

10. The MIC audio noise filtering method of claim 8, wherein the counting changes in the output includes incrementing a count when at least one of the output of the first and second comparators has changed a first number of times.

11. The MIC audio noise filtering method of claim 9, wherein the first number of times is 3.

12. The MIC audio noise filtering method of claim 8, wherein the detecting MIC audio noise at the pole of the four-pole audio jack using the counting includes detecting MIC audio noise at the pole of the four-pole audio jack if the count is within a specified range over the first period of time, the specified range not corresponding to the frequency of GSM communication.

13. The MIC audio noise filtering method of claim 12, wherein the specified range includes:
   (1) above 1 and below 34; and
   (2) above 54; and
   wherein the first period of time is 100 ms.

14. The MIC audio noise filtering circuit of claim 1, wherein the detection circuit is configured to distinguish between audio noise and GSM communication noise at the pole of the four-pole audio jack using the count.

15. The MIC audio noise filtering method of claim 8, including distinguishing between audio noise and GSM communication noise at the pole of the four-pole audio jack using the count.

* * * * *